United States Patent [19]
Lu et al.

[11] Patent Number: 5,895,241
[45] Date of Patent: Apr. 20, 1999

[54] METHOD FOR FABRICATING A CELL STRUCTURE FOR MASK ROM

[76] Inventors: Tao Cheng Lu, No. 36, Lane 1, Nueh-Chiang Street, San-min District Kaohsiung, Taiwan; Mam-Tsung Wang, No. 18, Alley 3, Lane 162, Science-park Rd., Hsin-chu, Taiwan

[21] Appl. No.: 08/825,301

[22] Filed: Mar. 28, 1997

[51] Int. Cl.⁶ ............................................. H01L 21/8246
[52] U.S. Cl. .................................... 438/275; 438/278
[58] Field of Search .............................. 438/275–281; 257/390–391

[56] References Cited

U.S. PATENT DOCUMENTS 5,688,661  11/1997  Choi ........................................ 438/275
5,712,203  1/1998  Hsu .......................................... 438/275

*Primary Examiner*—Jey Tsai
*Attorney, Agent, or Firm*—Wilson, Sonsini, Goodrich & Rosati

[57] ABSTRACT

A mask read-only-memory cell structure without ROM code implantation is presented. By using double polysilicon technology, ROM code cells which store data "0" can be replaced by cells with double polysilicon layers and an insulating layer between them. Normal cells with double polysilicon layers but without an insulating layer between them form normal cells store data "1". According to the invention, further scaling of mask ROM is possible and operating condition can be released because of high junction breakdown voltage. Furthermore, the double polysilicon technology makes redundancy circuit more easily to implement.

6 Claims, 4 Drawing Sheets

METHOD FOR FABRICATING A CELL STRUCTURE FOR MASK ROM

FIELD OF THE INVENTION

The present invention relates to a read-only-memory device for storing data information. More particularly, the present invention relates to a cell structure of semiconductor read-only-memory for storing data information and a method for fabricating the same.

BACKGROUND OF THE INVENTION

Read-only memory (ROM) semiconductor integrated circuits (IC) are widely used as memory storage devices for digital electronic equipment, in particular, microprocessor-based computer systems, to store predetermined programs. In a conventional semiconductor ROM device, the channel region of a memory cell is selectively implanted with ions to adjust the threshold voltage thereof depending on whether the programmed memory cell is turned on or turned off to represent a logic "1" or a logic "0" in binary, respectively.

Semiconductor ROMs generally store their data information in arrays of memory cells, wherein each memory cell is a single transistor. The data bits held by the memory cell transistors are permanently stored in the physical or electrical properties of the individual memory cell transistors.

Referring to FIG. 1, semiconductor ROMs are generally formed by intersecting a plurality of bitlines, 8a, 8b, 8c and 8d, which have been diffused into a semiconductor substrate 7 as shown in FIG. 2(a) with a plurality of wordlines, 9a, 9b and 9c, lying over the substrate 7. The wordlines 9 are physically separated from the bitlines 8 and the substrate 7 by a thin gate oxide layer 6 as shown in FIG. 2(a) such that an array of memory cell MOSFETs (metal-oxide-semiconductor field effect transistors) is formed. In the array, the wordlines 9 serve as gates for the memory cell transistors while the bitlines 8 serve as source and drain diffusion regions.

In the case of mask ROM, the coding of the data bits onto the memory cell transistors is generally performed by implanting ions into the channel regions of the appropriate memory cell transistors, thereby adjusting their threshold voltages. This step of coding the data into the ROM array structure through ion implantation is performed using a code mask which permits the implantation of ions into only certain regions of the semiconductor. The usage of a code mask leads to the name of mask ROM.

Conventionally, a ROM for storing data "0" is achieved by ROM code implantation. Then, conventional digital circuitry in the ROM employs sense amplifiers to sense the content of an addressed memory cell for "reading". The sensed result with respect to each memory cell within the ROM is identified as one of two possible electrical potential states. In other words, the memory content of a ROM memory cell as read is either a logic "1" or a logic "0".

The trend in the semiconductor industry has been to increase the number of memory cells to increase the storage capacity of a semiconductor integrated circuit chip, while reducing the size of the semiconductor device itself. Enlarged memory capacity and reduced memory semiconductor die size represent increased functionality and reduced cost. Great effort has been expended in the art of semiconductor chip manufacture to reduce the dimensions of semiconductor devices in order to squeeze more memory cells into the same semiconductor die area.

However, the ROM code implantation has become a critical process step when the cell size keeps scaling.

In order to ensure a high threshold voltage $V_t$ for a "0" state ROM code cell 10, the ROM code mask 11 has to be larger than the cell size as shown in FIG. 1 because misalignment of ROM code mask will lead to a low $V_t$ region and wrong data storage at cell 10. The results of ROM code implantation are shown in FIG. 2(a) and FIG. 2(b). However, considering the misalignment of ROM code mask 11 and lateral diffusion of ROM code implantation, the neighboring cells 12 and 13 will be affected as shown in FIG. 2(c). FIG. 2 (b) shows an aligned ROM code implant 14 which is used to form the cell into a state "0". FIG. 2 (c) shows a misaligned ROM code implant 15 which leads to the decrease of cell current at the neighboring cells 12 and 13, especially at data 1 cell, where the threshold voltage is different from that of data 0 cell, thereby causing a yield loss. Besides, the ROM code implantation greatly lowers the junction breakdown voltage which sets another limitation in operating condition.

OBJECTS AND ADVANTAGES

It is therefore an object of the present invention to provide a mask ROM cell structure that overcomes the limitations of the prior art. In particular, it is an object of the present invention to remove the critical process step, that is ROM code implantation.

It is also an object of the present invention to provide a mask ROM with further scaling cell size.

It is a still further object of the present invention to provide a mask ROM with high breakdown voltage so that the operating condition can be released.

SUMMARY OF THE INVENTION

Accordingly, the present invention concerns a mask ROM with a cell structure which does not have problems of mask misalignment because the critical step which is ROM code implantation has been removed, and a method for fabricating the same.

The preferred embodiment of a mask ROM cell structure according to present invention comprises:

(a) a semiconductor substrate embodying a first type background impurity dopant;

(b) a plurality of closely spaced line regions in said substrate adjacent the top surface of the substrate embodying a second opposite type impurity dopant that constitute the bitlines;

(c) a thin insulating gate layer on the surface of the said substrate;

(d) a plurality of closely spaced insulating lines located on the substrate and aligned with the said bitlines;

(e) a plurality of closely spaced conductive wordlines, arranged orthogonally relative to said bitlines, on said substrate;

(f) a pattern of zero state deposit regions of an insulating material selectively located between said insulating lines and underlying portions of said wordlines;

(g) said wordlines comprised of a lower layer of polysilicon, which is located between said insulating lines, a top layer of polysilicon and an intermediate layer which is arranged according to said pattern.

In accordance with this invention, a method for fabricating a mask ROM with a cell structure without ROM code implantation, comprises the following steps of:

(a) forming a gate oxide layer with a first insulating material on a doped substrate;

(b) depositing a first layer of polysilicon on said gate oxide layer;

(c) forming a layer of insulation with a second insulating material on said first layer of polysilicon layer;

(d) patterning a set of etched openings in said first layer of polysilicon and said layer of insulation by plurality of openings in a forming a bitline mask and etching said first layer of polysilicon and said layer of insulation through said plurality of openings in said bitline mask;

(e) implanting ions into said doped substrate through the set of etched openings of in said polysilicon and insulating layers;

(f) depositing a layer of insulating material at least in said set of etched openings;

(g) etching back said layer of insulating material so that said layer of insulating material has a height that is approximately equal to that of said layer of insulation;

(h) forming a ROM code mask to define the ROM code cells for storing data "0";

(i) patterning said layer of insulation by applying a photoresist and etching said layer of insulation;

(j) removing said photoresist;

(k) depositing a second layer of polysilicon on the patterned layer of insulation;

(l) forming a wordline mask; and (m) forming wordlines by at least part of said second layer of polysilicon and at least part of said first layer of polysilicon through openings in said wordline mask.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENT

The method for obtaining the ROM device, featuring no ROM code implantation, will now be described in detail. The structure of the ROM cell will also be described with the description of process.

Figure 1:
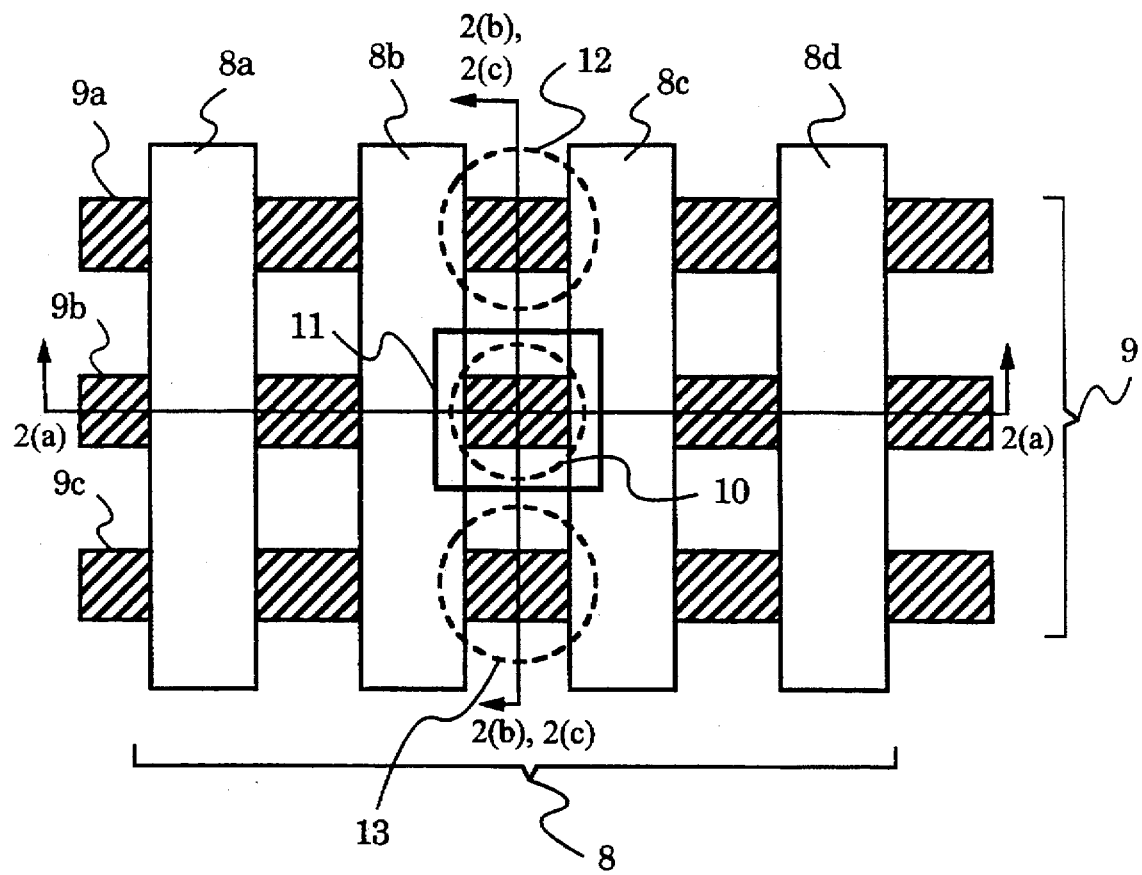
FIG. 1 is a simplified, two-dimensional overhead layout schematic view of a conventional mask ROM array structure according to the prior art.
Figure 2A:
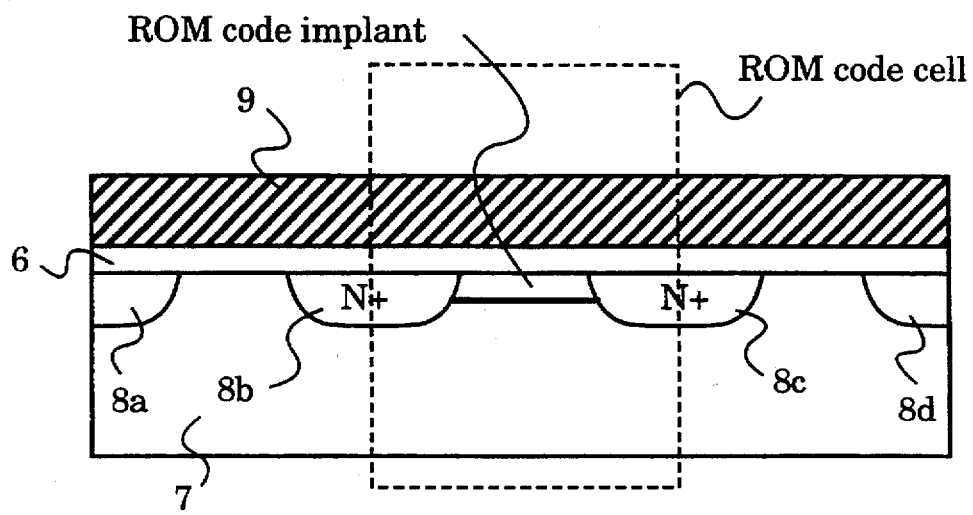
FIGS. 2(a)–2(c) show the cell structure and its problem with misalignment of coding mask in a two-dimensional fashion with different directions.
Figure 2B:
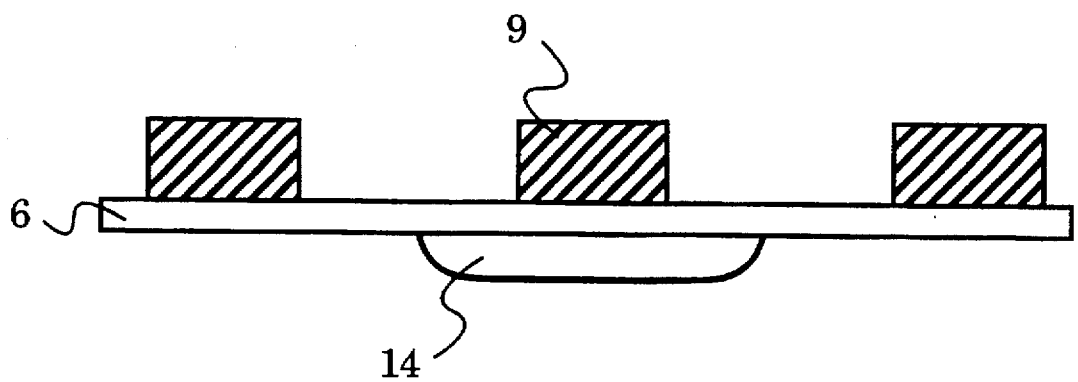
Figure 2C:
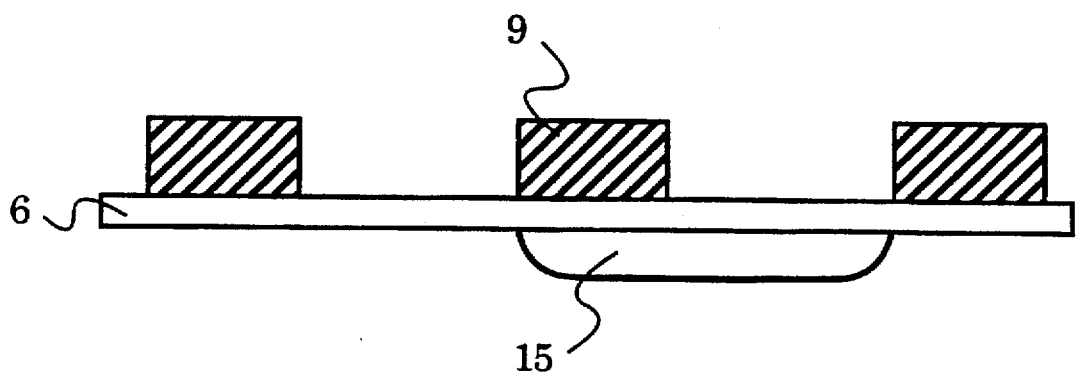
Figure 3:
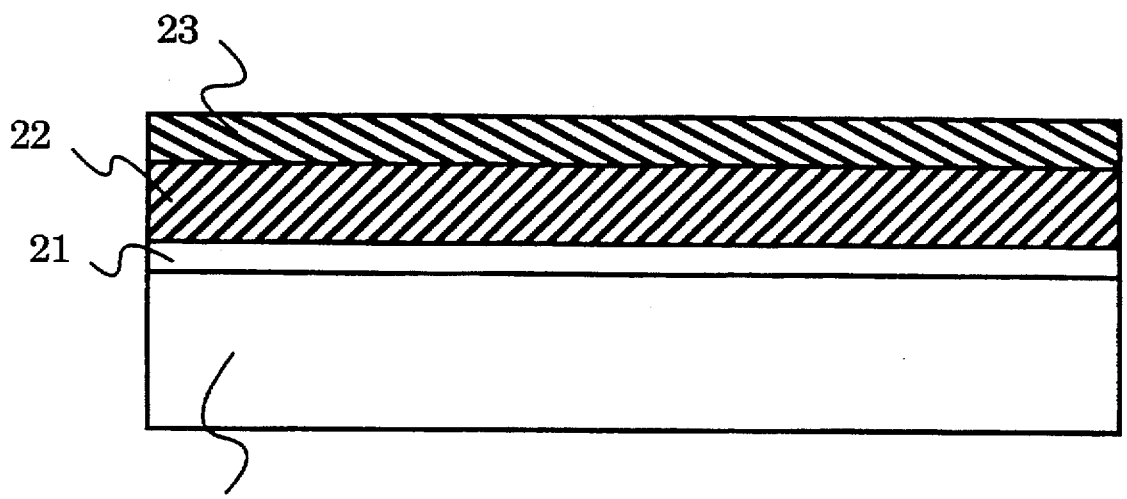
FIGS. 3–8 schematically illustrate a series of cross-sectional representations that describe the process steps used to create the ROM device, featuring no ROM code implantation.

A substrate, 20, composed of p type, single crystal silicon is used and shown in FIG. 3.

A thin layer of silicon oxide, 21, is deposited with conventional well known oxide depositing process on the top of substrate 20.

Then, a first layer of polysilicon, 22, is also formed on the top of silicon oxide layer 21 also with conventional well known polysilicon depositing process.

On the top of the first polysilicon layer 22, a silicon nitride layer 23 is deposited using conventional well known silicon nitride depositing process.

The silicon nitride layer 23 is formed to a thickness of about 30 nanometers.

Figure 4:
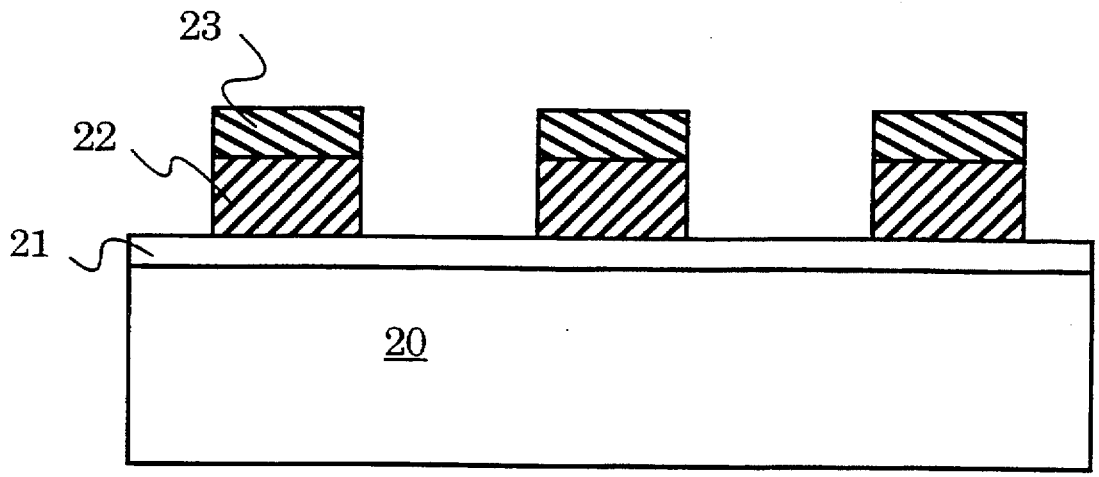

Using bitline mask to pattern polysilicon gate is illustrated in FIG. 4. Conventional masking and etching processes are used in this step so that the first layer of polysilicon 22 and layer of silicon nitride 23 are etched to form closely spaced rigid strips.

Figure 5:
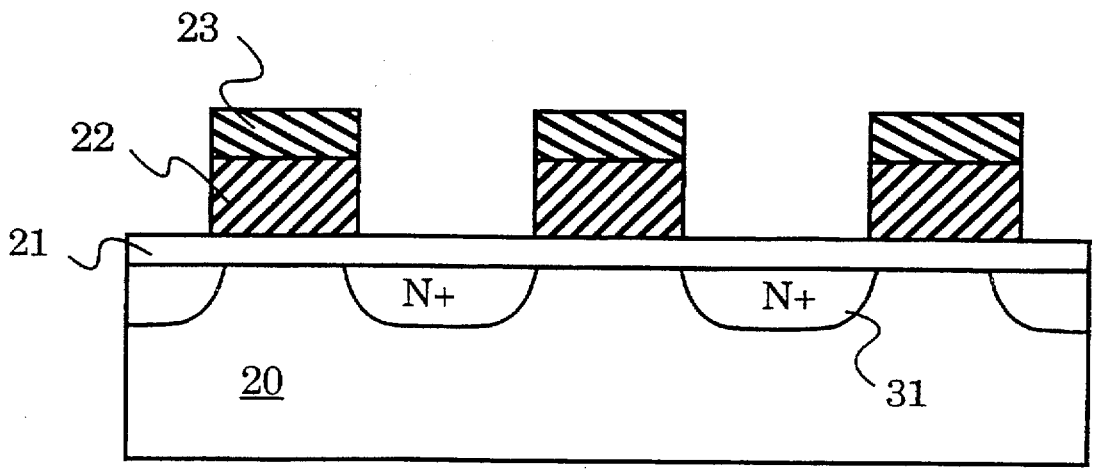
Figure 6:
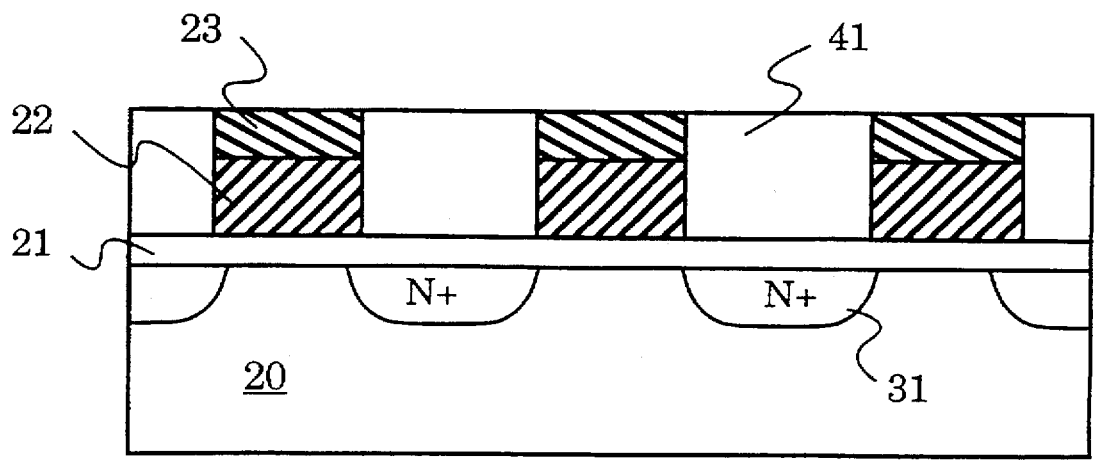

These closely spaced rigid strips function as self-align mask for the next step of process as shown in FIG. 5. In this step, self-aligned implantation generates $N^+$ diffusion regions, 31, in substrate 20 for source and drain with a conventional well known diffusion process.

The diffusion regions 31 are also known as bitlines of ROM devices.

In the next step, thick silicon oxide regions, 41, are formed, with conventional oxide depositing process, between the rigid strips. An etching back process is necessary in this step to make sure that there are no extra oxides remaining deposited on the top of rigid strips and the heights of thick silicon oxide regions 41 and the rigid strips are almost the same. The purpose of this process is to isolate the rigid strips from the thick silicon oxide regions 41.

Figure 7:
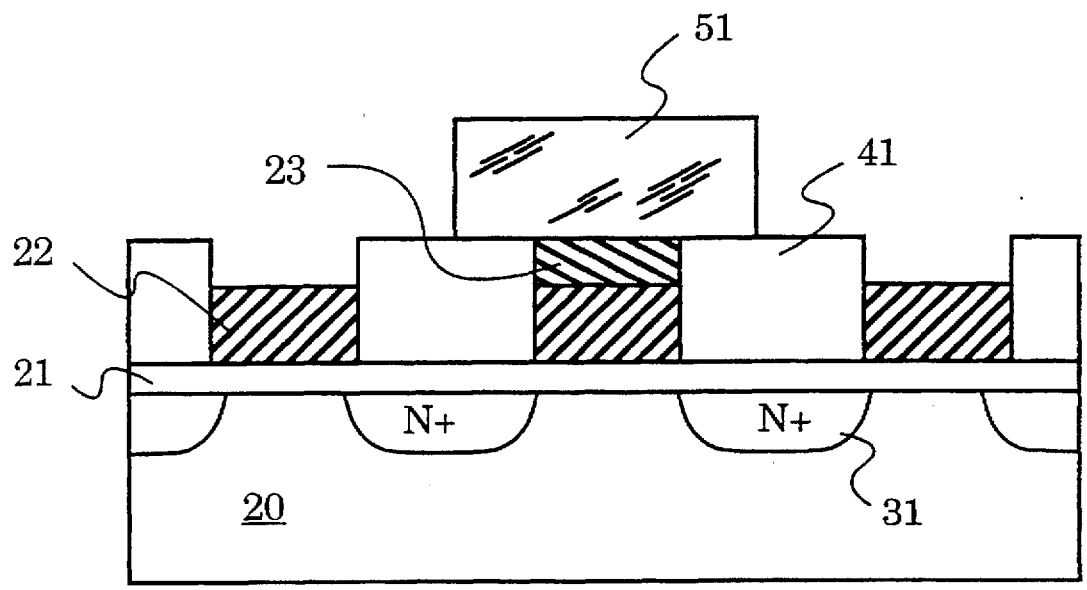

FIG. 7 shows how to use a conventional ROM code mask to define the ROM code cells for storing data "0" and to remove the silicon nitride layer 23 of normal cells for storing data "1".

In this step, the conventional ROM code mask is aligned on the top of device. Photoresist, 51, is deposited with a conventional photoresist depositing process through the openings of the mask. The ROM code mask is so designed that the openings are formed on the top of cells where data "1" will be stored, these cells to be conductive in response to a read voltage on the wordline.

An etching process is performed in this step to remove the silicon nitride layer 23 from those areas.

A conventional photoresist removing process is performed to remove the photoresist on the top of cells where data "0" will be stored.

Figure 8:
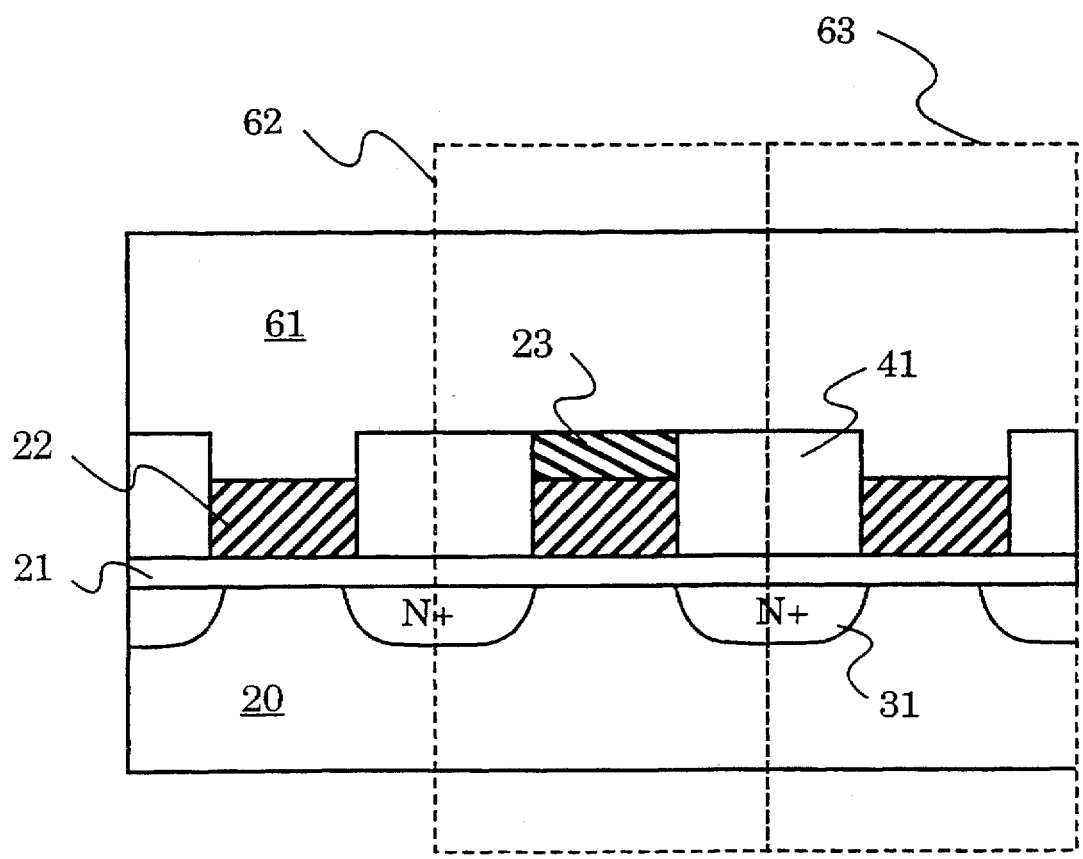

A second layer of polysilicon, 61, is deposited with conventional polysilicon depositing process on the top of the whole device as shown in FIG. 8.

After deposition of the second layer of polysilicon 61, a wordline mask is used to disconnect the connection between wordlines. This process includes applying the wordline mask on the top of the device and etching off the second and then the first layers of polysilicon through the openings of the wordline mask with conventional polysilicon etching process.

Therefore, a ROM code cell, 62, where data "0" will be stored is formed with described processes. Another ROM cell, 63 is also formed with the same process.

For the conventional cell structure as shown in FIG. 1 and FIGS. 2(a)–(c), the cell currents for reading data "0" and data "1" are distinguished by high $V_t$ and low $V_t$. In the new cell structure, the cell currents for reading data "0" and data "1" are distinguished by different gate voltage. As shown in FIG. 8, when the wordline is selected, the voltage of the second layer of polysilicon 61 is Vcc. For the normal cells of storing data "1", the gate voltage of the first layer of polysilicon 22 is equal to Vcc because the first layer of polysilicon is contacted to the second layer of polysilicon 61 directly. However, for the ROM code cells of storing data "0", the gate voltage of the first layer of polysilicon 22 is much lower than Vcc because the first layer of polysilicon 22 is isolated from the second layer of polysilicon 61 by an insulating layer 23. In such a manner, the cell currents of reading data "0" and data "1" can be distinguished.

A significant advantage of the process and cell structure of this invention is that no ROM code implantation was employed for coding so the problems associated with misalignment of ROM code mask can be solved.

By using double polysilicon technology as mentioned in this invention, ROM code cells which store data "0" can be replaced by cells with double polysilicon layers and an insulating layer between them. Cells with double polysilicon layers but without an insulating layer between them form normal cells which store data "1". According to the present invention, further scaling of Mask ROM is possible and operating condition can be released because of high junction breakdown voltage.

Another advantage of the present invention is that the double polysilicon technology makes redundancy circuit more easily implemented.

Many modifications of the preferred embodiment are possible without exceeding the scope of the present invention, and many of these would be obvious to those skilled in the art. In addition, certain details of the present description can be changed in obvious ways without altering the function or results of the essential ideas of the present invention. Therefore, although the present invention has been described in connection with the preferred embodiment, it will be understood that this description is not intended to limit the invention thereto, but the invention is intended to cover all modifications and alternative constructions falling within the spirit and scope of the invention as expressed in the appended claims and their legal equivalents.

What is claimed is:

1. A method for fabricating a mask read-only-memory cell structure for storing data information, the method comprising:

(a) forming a gate oxide layer with a first insulating material on a doped substrate;

(b) depositing a first layer of polysilicon on said gate oxide layer;

(c) forming a layer of insulation with a second insulating material on said first layer of polysilicon;

(d) patterning a set of etched openings in said first layer of polysilicon and said layer of insulation by forming a plurality of openings in a bitline mask and etching said first layer of polysilicon and said layer of insulation through said plurality of openings in said bitline mask;

(e) implanting ions into said doped substrate through the set of etched openings in said polysilicon and insulating layers;

(f) depositing a layer of insulating material at least in said set of etched openings;

(g) etching back said layer of insulating material so that said layer of insulating material has a height that is approximately equal to that of said layer of insulation;

(h) forming a ROM code mask to define the ROM code cells for storing data "0";

(i) patterning said layer of insulation by applying a photoresist and etching said layer of insulation;

(j) removing said photoresist;

(k) depositing a second layer of polysilicon on the patterned layer of insulation;

(l) forming a wordline mask; and (m) forming wordlines by etching at least part of said second layer of polysilicon and at least part of said first layer of polysilicon through openings in said wordline mask.

2. A method for fabricating a mask read-only-memory cell structure according to claim 1, wherein said first insulating material comprises silicon oxide.

3. A method for fabricating a mask read-only-memory cell structure according to claim 1, wherein said doped substrate is doped with a p type impurity dopant.

4. A method for fabricating a mask read-only-memory cell structure according to claim 1, wherein said doped substrate comprises silicon.

5. A method for fabricating a mask read-only-memory cell structure according to claim 1, wherein said second insulating material comprises silicon nitride.

6. A method for fabricating a mask read-only-memory cell structure according to claim 1, wherein said implanting ions comprise boron.

* * * * *